(12) United States Patent
Alben et al.

(10) Patent No.: US 7,836,318 B1
(45) Date of Patent: Nov. 16, 2010

(54) MEMORY CLOCK SLOWDOWN

(75) Inventors: Jonah M. Alben, San Jose, CA (US);
Sean Jeffrey Treichler, Mountain View, CA (US); Adam E. Levinthal, Redwood City, CA (US)

(73) Assignee: NVIDIA Corporation, Santa Clara, CA (US)

( * ) Notice: Subject to any disclaimer, the term of this patent is extended or adjusted under 35 U.S.C. 154(b) by 766 days.

(21) Appl. No.: 11/561,666

(22) Filed: Nov. 20, 2006

Related U.S. Application Data

(63) Continuation of application No. 10/741,149, filed on Dec. 18, 2003, now Pat. No. 7,187,220.

(51) Int. Cl.
*G06F 1/32* (2006.01)

(52) U.S. Cl. .................. 713/322; 713/300; 713/500

(58) Field of Classification Search ............... 713/300, 713/320, 322, 323, 600, 500, 501, 503
See application file for complete search history.

(56) References Cited

U.S. PATENT DOCUMENTS

| | | | |
|---|---|---|---|
| 4,659,999 A * | 4/1987 | Motoyama et al. | 331/2 |
| 5,197,126 A * | 3/1993 | Harrell | 713/501 |
| 5,317,601 A * | 5/1994 | Riordan et al. | 375/356 |
| 5,818,366 A | 10/1998 | Morley | |
| 5,991,883 A * | 11/1999 | Atkinson | 713/300 |
| 6,362,680 B1 | 3/2002 | Barnes | |
| 6,472,904 B2 | 10/2002 | Andrews et al. | |
| 6,525,565 B2 | 2/2003 | Young et al. | |
| 6,614,371 B2 | 9/2003 | Zhang | |
| 6,777,980 B2 | 8/2004 | Young et al. | |
| 7,042,263 B1 | 5/2006 | Johnson et al. | |
| 7,149,909 B2 * | 12/2006 | Cui et al. | 713/322 |
| 2004/0073821 A1 * | 4/2004 | Naveh et al. | 713/320 |

* cited by examiner

*Primary Examiner*—Mark Connolly
*Assistant Examiner*—Paul B Yanchus, III
(74) *Attorney, Agent, or Firm*—Townsend and Townsend and Crew LLP

(57) ABSTRACT

Circuits, methods, and apparatus for slowing clock circuits on a graphics processor integrated circuit in order to reduce power dissipation. An exemplary embodiment of the present invention provides a graphics processor having two memory clocks, specifically, a switched memory clock and an unswitched memory clock. The switched memory clock frequency is reduced under specific conditions, while the unswitched memory clock frequency remains fixed. In a specific embodiment, the switched memory clock frequency is reduced when related graphics, display, scaler, and frame buffer circuits are not requesting data, or are such data requests can be delayed. Further refinements to the present invention provide circuits, methods, and apparatus for ensuring that the switched and unswitched memory clock signals remain in-phase and aligned with each other.

20 Claims, 10 Drawing Sheets

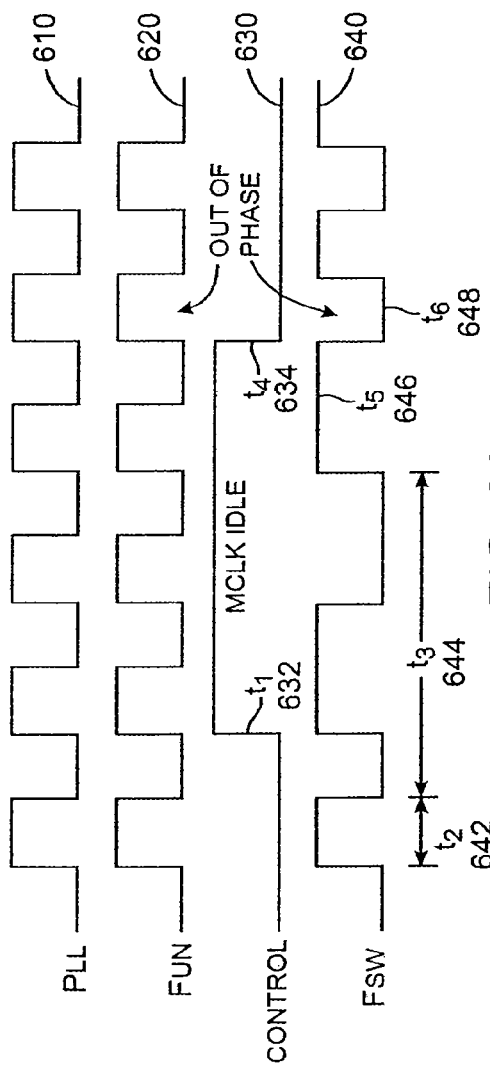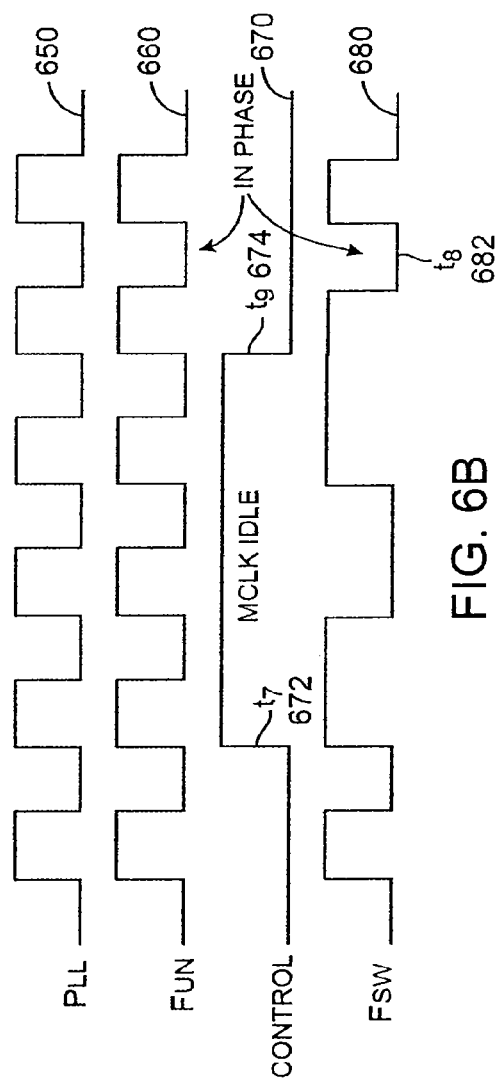

MEMORY CLOCK SLOWDOWN

CROSS-REFERENCES TO RELATED APPLICATIONS

This application is a continuation of application Ser. No. 10/741,149, filed Dec. 18, 2003, which is related to commonly-assigned U.S. patent application Ser. Nos. 10/295,619, titled "A PROCESSOR PERFORMANCE ADJUSTMENT SYSTEM AND METHOD," by Kelleher et al., 10/742,444, titled "DYNAMIC MEMORY CLOCK ADJUSTMENTS," by Wagner et al., and 10/741,149, titled "MEMORY CLOCK SLOWDOWN," by Alben et al., which are all incorporated by reference.

BACKGROUND

The present invention relates to reducing a clock signal's frequency in order to reduce power dissipation in graphics processor integrated circuits.

It is often desirable to decrease the power dissipation in integrated circuits. A reduction in power dissipation lengthens the life of an integrated circuit, simplifies or eliminates components used for cooling such as fans and heat sinks, and simplifies board and system level power distribution.

In CMOS circuits, where there are few, if any, static bias sources, power dissipation is primarily due to voltage changes of transient signals. As a node in an integrated circuit changes in voltage, capacitance at that node is either charged or discharged. This charging and discharging translates into supply current, which results in integrated circuit power dissipation. As the frequency of these transient signals increase, the charging and discharging currents occur more frequently, and power dissipation increases.

A primary source of voltage transients in many integrated circuits is clock signals. For example, it has been found that for many graphics processors, the primary sources of power dissipation are clock signals in general, and memory clock signals in particular. The memory clock is typically responsible for clocking circuits that store and retrieve data to and from an external memory, and for providing data to one or more display heads. But the memory clock is also provided to a delay-locked loop (DLL) in the external memory, and these DLLs tend to lose lock if the memory clock's frequency changes.

Thus, it is desirable to save power by reducing a memory clock's frequency when its associated circuitry is either idle or can process data at a slower rate. It is also preferable to do this while maintaining the frequency of the memory clock provided to the external memory.

SUMMARY

Accordingly, embodiments of the present invention provide circuits, methods, and apparatus for slowing clock signals on a graphics processor integrated circuit in order to reduce power dissipation. One exemplary embodiment of the present invention provides a graphics processor having two memory clocks, a switched memory clock and an unswitched memory clock. The switched memory clock's frequency is reduced under specific conditions, while the unswitched memory clock's frequency remains fixed. In a specific embodiment, the switched memory clock's frequency is reduced when related graphics, display, scaler, and frame buffer circuits are either not requesting data, or such data requests can be delayed or processed at a lower clock rate. Further refinements provide circuits, methods, and apparatus for ensuring that the switched and unswitched memory clock signals remain in-phase and aligned with each other.

An exemplary embodiment of the present invention provides an integrated circuit. This integrated circuit includes a phase-locked loop configured to provide a first synchronizing signal, a first divider configured to receive the first synchronizing signal and provide a second synchronizing signal, and a second divider configured to receive the first synchronizing signal and provide a third synchronizing signal. The first synchronizing signal transitions at a first frequency, the second synchronizing signal transitions at a second frequency, while the third synchronizing signal transitions at a frequency that is switchable between the second frequency and a third frequency.

Another exemplary embodiment of the present invention provides a method of reducing power dissipation in a graphics processor. The method includes providing a first memory clock and a second memory clock, placing a portion of the graphics processor in a reduced power state by reducing the second memory clock's frequency, checking a state of the first memory clock and a state of the second memory clock, and removing the portion of the graphics processor from the reduced power state by increasing the second memory clock's frequency when the state of the first memory clock matches the state of the second memory clock.

A further exemplary embodiment of the present invention provides a graphics processor. This graphics processor includes a phase-locked loop having an output, a first divider circuit coupled to the output of the phase-locked loop, and a second divider coupled to the output of the phase-locked loop. The first divider divides a signal received from the output of the phase-locked loop by a first value, while the second divider divides the signal received from the output of the phase-locked loop by the first value if a control signal is inactive and by a second value if the control signal is active.

A better understanding of the nature and advantages of the present invention may be gained with reference to the following detailed description and the accompanying drawings.

BRIEF DESCRIPTION OF THE DRAWINGS

FIG. 6A is a timing diagram illustrating how a switched clock signal may become out of phase with an unswitched clock signal, while FIG. 6B is a timing diagram showing the switched clock signal in phase with the unswitched clock following a power down mode;

DESCRIPTION OF EXEMPLARY EMBODIMENTS

Figure 1:
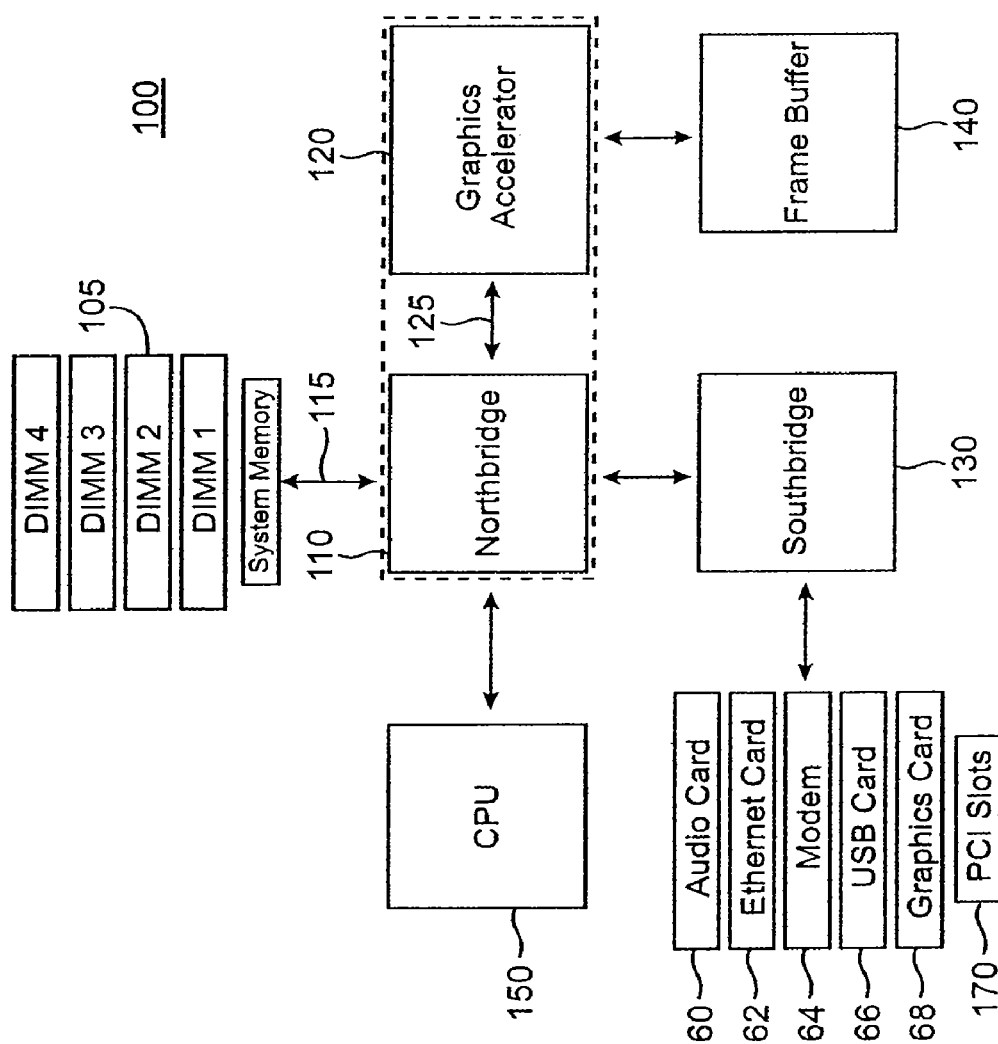
FIG. 1 is a block diagram of a computing system that benefits by incorporation of embodiments of the present invention.

FIG. 1 is a block diagram of a computing system 100 that benefits by incorporation of embodiments of the present invention. This computing system 100 includes a Northbridge 110, graphics accelerator 120, Southbridge 130, frame buffer 140, central processing unit (CPU) 150, audio card 160, Ethernet card 162, modem 164, USB card 166, graphics card 168, PCI slots 170, and memories 105. This figure, as with all the included figures, is shown for illustrative purposes only, and does not limit either the possible embodiments of the present invention or the claims.

The Northbridge 110 passes information from the CPU 150 to and from the memories 105, graphics accelerator 120, and Southbridge 130. Southbridge 130 interfaces to external communication systems through connections such as the universal serial bus (USB) card 166 and Ethernet card 162. The graphics accelerator 120 receives graphics information over the accelerated graphics port (AGP) bus 125 through the Northbridge 110 from CPU 150 and directly from memory or frame buffer 140. The graphics accelerator 120 interfaces with the frame buffer 140. Frame buffer 140 may include a display buffer that stores pixels to be displayed.

In this architecture, CPU 150 performs the bulk of the processing tasks required by this computing system. In particular, the graphics accelerator 120 relies on the CPU 150 to set up calculations and compute geometry values. Also, the audio or sound card 160 relies on the CPU 150 to process audio data, positional computations, and various effects, such as chorus, reverb, obstruction, occlusion, and the like, all simultaneously. Moreover, the CPU 150 remains responsible for other instructions related to applications that may be running, as well as for the control of the various peripheral devices connected to the Southbridge 130.

Figure 2:
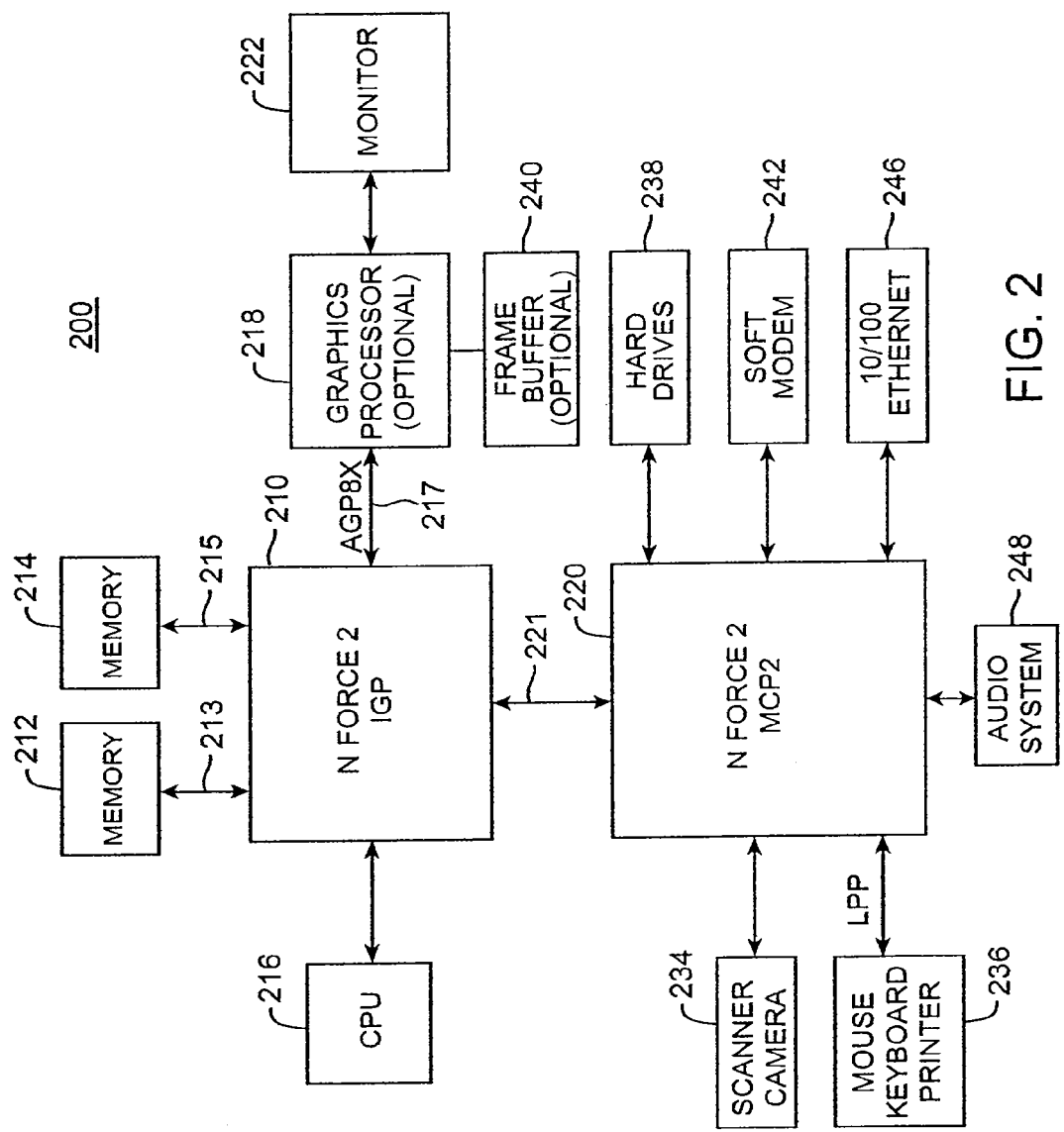
FIG. 2 is a block diagram of an improved computer system that benefits by incorporation of embodiments of the present invention.

FIG. 2 is a block diagram of an improved computer system 200 that benefits by incorporation of embodiments of the present invention. This improved computing system 200 includes an NVIDIA nForce™2 integrated graphics processor (IGP) 210, an nForce2 media communications processor (MCP2) 220, memory 212 and 214, CPU 216, optional graphics processor 218 and frame buffer 240, monitor 222, scanner or camera 234, mouse, keyboard, and printer 236, hard drives 238, soft modem 242, Ethernet network or LAN 246, and audio system 248.

This revolutionary system architecture has been designed around a distributed processing platform, which frees up the CPU to perform tasks best suited to it. Specifically, the nForce2 IGP 210 includes a graphics processing unit (GPU) (not shown) which is able to perform graphics computations previously left to the CPU 216. Alternately, the nForce2 IGP 210 may interface to an optional GPU 218 which performs these computations. Also, nForce2 MCP2 220 includes an audio processing unit (APU), which is capable of performing many of the audio computations previously done by the CPU 216. In this way, the CPU is free to perform its tasks more efficiently. Also, by incorporating a suite of networking and communications technologies such as USB and Ethernet, the nForce2 MCP2 220 is able to perform much of the communication tasks that were previously the responsibility of the CPU 216.

In this architecture, the nForce2 IGP 210 communicates with memories 212 and 214 over buses 213 and 215. The nForce2 IGP 210 also interfaces to an optional graphics processor 218 over an advanced AGP bus 217. In various computer systems, optional processor 218 may be removed, and the monitor 222 may be driven by the nForce2 IGP 210 directly. In other systems, there may be more than one monitor 222, some or all of which are coupled to optional graphics processor 218 or the nForce2 IGP 210 directly. The nForce2 IGP 210 communicates with the nForce2 MCP2 220 over a HyperTransport™ link 221. The optional graphics processor 218 may also interface with external memory, which is not shown in this example. Embodiments of the present invention may be used to improve changes in the frequency of the clock signals at the interfaces to memories 212 and 214, from the optional graphics processor 218 to its external memory (not shown), or to other optional memories not shown here, or other memory interfaces or other circuits in other digital systems.

The nForce2 MCP2 220 contains controllers for Ethernet connections 246 and soft modem 242. The nForce2 MCP 220 also includes an interface for a mouse, keyboard, and printer 236, and USB ports for cameras and scanners 234 and hard drives 238.

This arrangement allows the CPU 216, the nForce2 IGP 210, and the nForce2 MCP2 220, to perform processing independently, concurrently, and in a parallel fashion.

Figure 3:
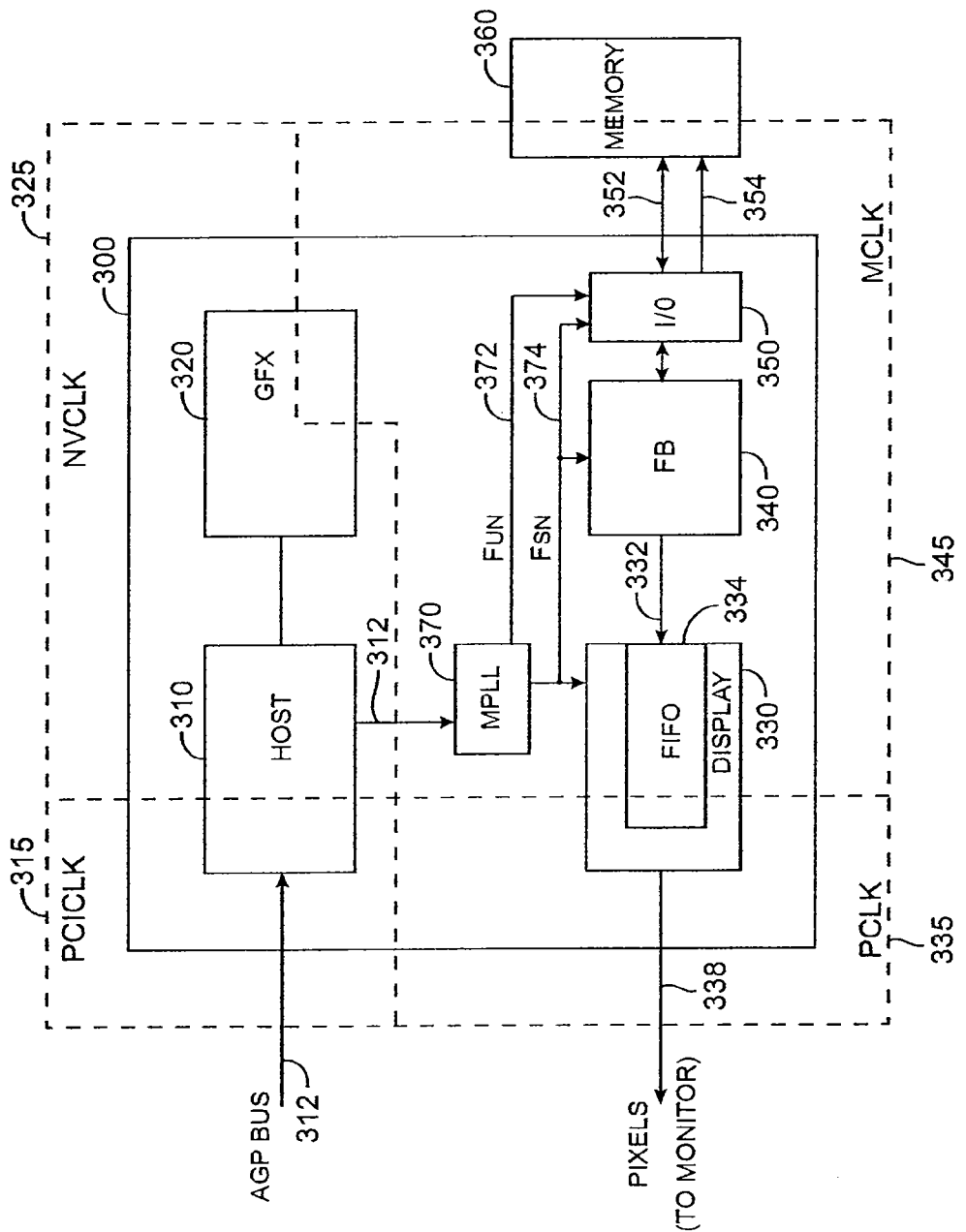
FIG. 3 is a block diagram of a graphics processor that is consistent with an embodiment of the present invention.

FIG. 3 is a block diagram of a graphics processor 300 that is consistent with an embodiment of the present invention. This graphics processor 300 includes a number of circuit blocks operating in one or more clock domains. The host 310 receives primitives, textures, and other data over the AGP bus 312, the frame buffer 340 stores data in the external memory 360, and the display circuit 330 provides pixels to a monitor 222 over pixel bus 338. This graphics processor 300 may be included as part of the nForce2 IGP 210, optional external graphics processor 218, or as another type of graphics processing circuit. The graphics processor 300 may be found in a computing, gaming, server, networking, or other type of system. Typically, graphics processor 300 is formed on an integrated circuit, though it may be formed on more than one integrated circuit, or it may be part of an integrated circuit.

The graphics processor 300 includes a host 310, graphics circuit 320, display circuit 330, frame buffer 340, input/output cells 350, and external memory 360. This figure and the other included figures are shown for illustrative purposes only, and do not limit either the possible embodiments of the present invention or the claims.

The host 310 receives data over the AGP bus 312. Among its many functions, the host 310 provides control bits to the memory clock phase-locked loop MPLL 370 over line 312. The host 310 receives data in the PCI clock PCICLK domain 315, and provides primitives, textures, and other information to the graphics circuit 320 in the NVCLK clock domain 325. In a specific embodiment of the present invention, the PCICLK domain 315 operates approximately at 200 MHz, while the NVCLK domain 325 operates in the range of 150 to 300 MHz.

Most of the graphics circuit 320 operates in the NVCLK domain 325, though a portion operates in the memory clock MCLK domain 345. The frame buffer 340 also operates in the memory clock MCLK domain 345. The frame buffer 340 provides addresses, and writes and reads data to and from the memory 360 over bus 352 using the input/output block 350. The frame buffer 340 provides data to a first-in-first-out memory (FIFO) 334 in the display 330 over bus 332. The FIFO 334 queues pixels for display on monitor 222. The FIFO 334 receives these pixels in the MCLK domain 345 and provides pixels in the pixel clock PCLK domain 335. In the specific embodiment, MCLK's frequency is in a range of 100 to 200 MHz, while PCLK's frequency is approximately 160 MHz, depending on the refresh rate and resolution of monitor 222.

Again, it is often desirable to reduce power dissipation on a graphics processor integrated circuit by reducing the frequency of operation of one or more of the clock signals in these clock domains. This may be done when a circuit block is temporarily not needed, for example, when an image displayed on monitor 222 is not changing, or data is not need to be written to or read from the external memory 360. At such a time, one or more of the clock domains may enter a power down or idle state.

In a specific embodiment of the present invention, the memory clock MCLK domain 345 accounts for a significant portion of the total integrated circuit power dissipation. Accordingly, an embodiment of the present invention provides a memory clock signal MCLK that is capable of switching to a lower frequency of operation in a power-down state. For example, when the frame buffer has filled the FIFO 334, it may idle for a time until more pixels are needed. When a low-water mark is reached in the FIFO, the frame buffer "wakes up," that is, the power-down state is exited, and the frame buffer begins to refill the FIFO 334. It should be noted that the transition out of the idle or power-down state is more important than the transition into the idle or power-down state. This is because lag time going into the idle state simply costs a small amount of power dissipation, while lag time in exiting the power-down state may impair performance and cause a disruption on an image displayed on monitor 222.

Specifically, the memory PLL MPLL 370 provides two clock outputs, one an unswitched memory clock signal Fun on line 372 and the other a switched memory clock signal Fsw on line 374. The unswitched memory clock signal Fun on line 372 remains at its full rate, even in the power-down mode, while the switched memory clock signal Fsw on line 374 switches from its full rate to a lower frequency in the power-down mode. For example, in a specific embodiment of the present invention, the switched memory clock signal Fsw on line 374 switches to a clock frequency that is one-fourth to one-eighth of its full rate when the graphics processor enters the power-down mode. Alternately, the switched memory clock signal Fsw on line 374 may be shut off, though care should be taken to avoid logic states where a circuit is put to "sleep" by having its clock shut off, only to discover that it cannot receive an instruction to "wake-up."

The switched memory clock signal Fsw on line 374 clocks the FIFO 334, the frame buffer 340, and part of the input/output circuitry 350. The unswitched memory clock signal Fun on line 372 clocks a portion of the input/output circuitry 350. The unswitched memory clock signal Fun on line 372 is also provided by the input/output circuitry 350 as a memory clock signal MCLK on line 354. The memory clock signal MCLK on line 354 is unswitched to avoid clock-locking problems in a delay-locked loop circuit (not shown) in the external memory 360. That is, the delay-locked loop circuit in the external memory 360 loses lock if the memory clock signal MCLK on line 354 changes in frequency, so that signal is not switched.

Also, the external memory 360 may be a dynamic random-access memory that needs to be refreshed on a periodic basis. This refresh rate should be independent of any change in the frequency of the memory clock signal MCLK on line 354. Typically, the refresh signal is triggered by a signal that is generated by the memory clock signal MCLK on line 354 being divided or reduced in frequency by a divider circuit. Accordingly, that divider circuit should account for the change in clock frequency brought about by the device entering a power-down or idle mode. This may be done by dividing the unswitched memory clock signal Fun on line 372. Alternately, it may be done by using the switched clock Fsw on line 374 and changing the divide ratio to compensate. For example, if the switched memory clock signal Fsw on line 374 is reduced in frequency by a factor of eight, the divide ratio may be changed by eight. Circuits, methods, and apparatus that may be used to switch the switched memory clock signal Fsw on line 374 can be found in copending U.S. patent application Ser. No. 11/944,429, titled "DYNAMIC MEMORY CLOCK ADJUSTMENTS," by Wagner et al.

Figure 4:
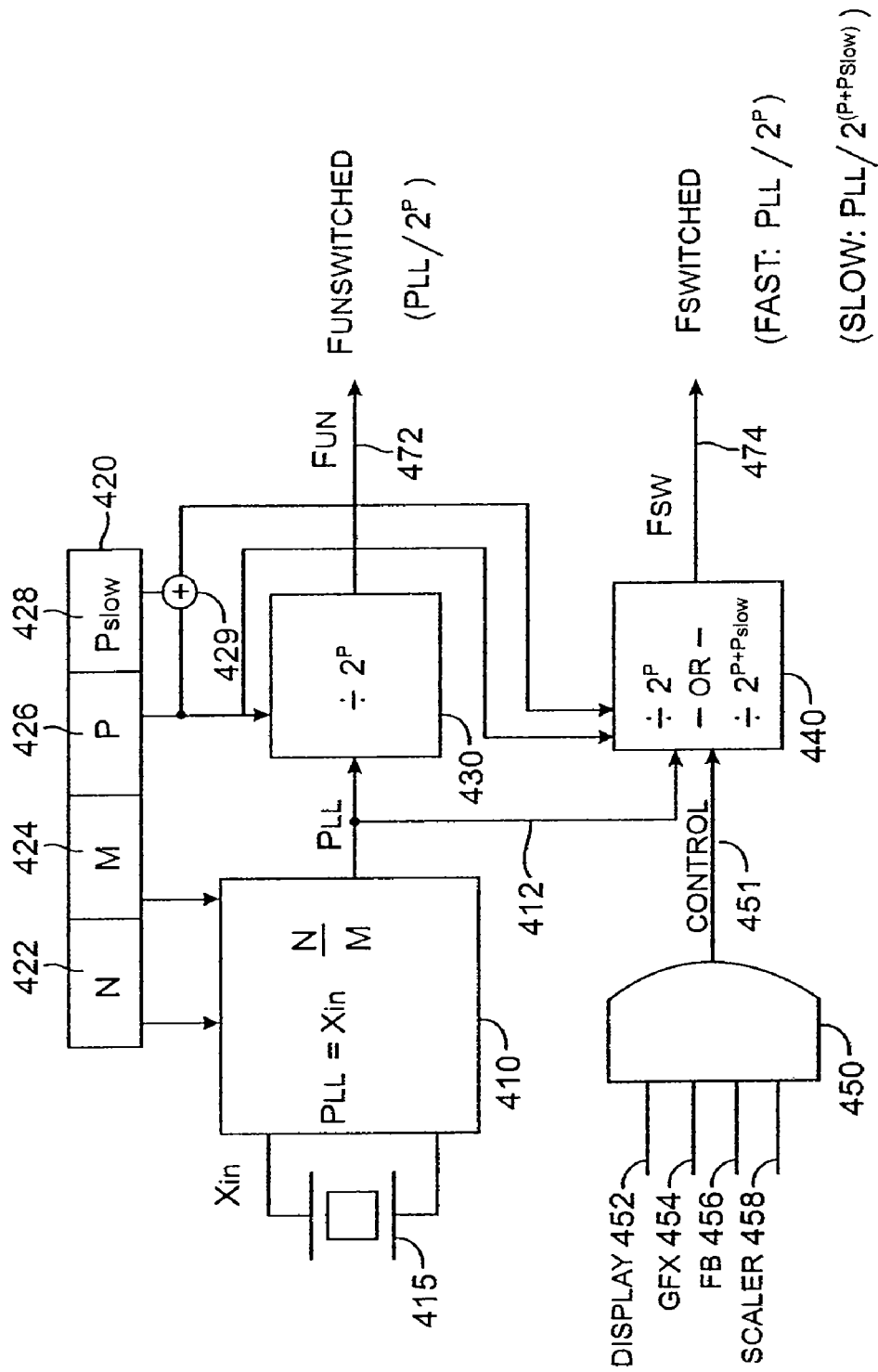
FIG. 4 is a block diagram of a memory clock phase-locked loop (PLL) and associated circuitry that may be used as the memory clock PLL in FIG. 3 or as a memory clock PLL and associated circuitry in other embodiments of the present invention.

FIG. 4 is a block diagram of a memory clock PLL and associated circuitry that may be used as the memory clock PLL MPLL 370 in FIG. 3 or as a memory clock PLL and associated circuitry in other embodiments of the present invention. This memory clock PLL and associated circuitry includes PLL 410, which is driven by crystal 415, frequency dividers 430 and 440, switching logic gate 450, and programmable registers 420.

The PLL 410 receives a signal at frequency Xin from crystal 415. Crystal 415 may be replaced by an oscillator or other stable clock source, and it may be shared by the other PLLs on the graphics processor integrated circuit, for instance, it may be shared with the PLLs that generate clocks in the PCLK domain 335 and NVCLK domain 325.

The output of the PLL 410, signal PLL on line 412, is received by the dividers 430 and 440. Divider 430 provides an unswitched memory clock signal Fun on line 472, while divider 440 provides a switched memory clock signal Fsw on line 474. The switched clock signal Fsw on line 474 is switched under control of the switch logic gate 450. If each of its inputs are active, the switched clock signal may switch to a lower frequency, that is, it may enter the power down or idle mode. Specifically, if information is not needed by any of the heads in the display, the display signal on line 452 is active. Similarly, if the graphics pipeline is not requesting data, the signal GFX on line 454 is active. If the frame buffer is not required to access data, its corresponding signal FB on line 456 is active, while if the scaler is inactive, the scaler signal on line 458 is active. When each of the signals at the input of the switch logic gate 410 are active, the frequency of the switched memory clock signal Fsw on line 474 may decrease.

The contents of control register 420 include values for N 422, M 424, P 426, and Pslow 428. The host 310 receives these values over the AGP bus 312 and loads them in the control register 420. The values stored as N 422 and M 424 scale the output frequency of the signal PLL on line 412. Specifically, the frequency of the signal PLL on line 412 is equal to the frequency Xin times N 422 divided by M 424. The divider 430 divides the frequency of the signal PLL on line 412 by the factor $2^{\wedge}P$, where a "^" is a symbol meaning "to the power of." The adder 429 adds the contents of P 426 and Pslow 428 and provides it along with the value of P 426 to divider 440. In the high-speed or fast mode, the frequency of the switched memory clock signal Fsw on line 474 is equal to the frequency of the signal PLL on line 412 divided by $2^{\wedge}P$. In the slow mode, the frequency of the switched memory clock signal Fsw on line 474 is equal to the frequency of the signal PLL on line 412 divided by $2^{\wedge}(P+Pslow)$.

It will be appreciated by one skilled in the art that variations may be made to this circuit consistent with the present invention. For example, one divider having multiple outputs may be shared between the dividers 430 and 440, where one of the multiple outputs are selected by dividers 430 and 440. An example of such an arrangement is shown below in FIG. 10.

Figure 5:
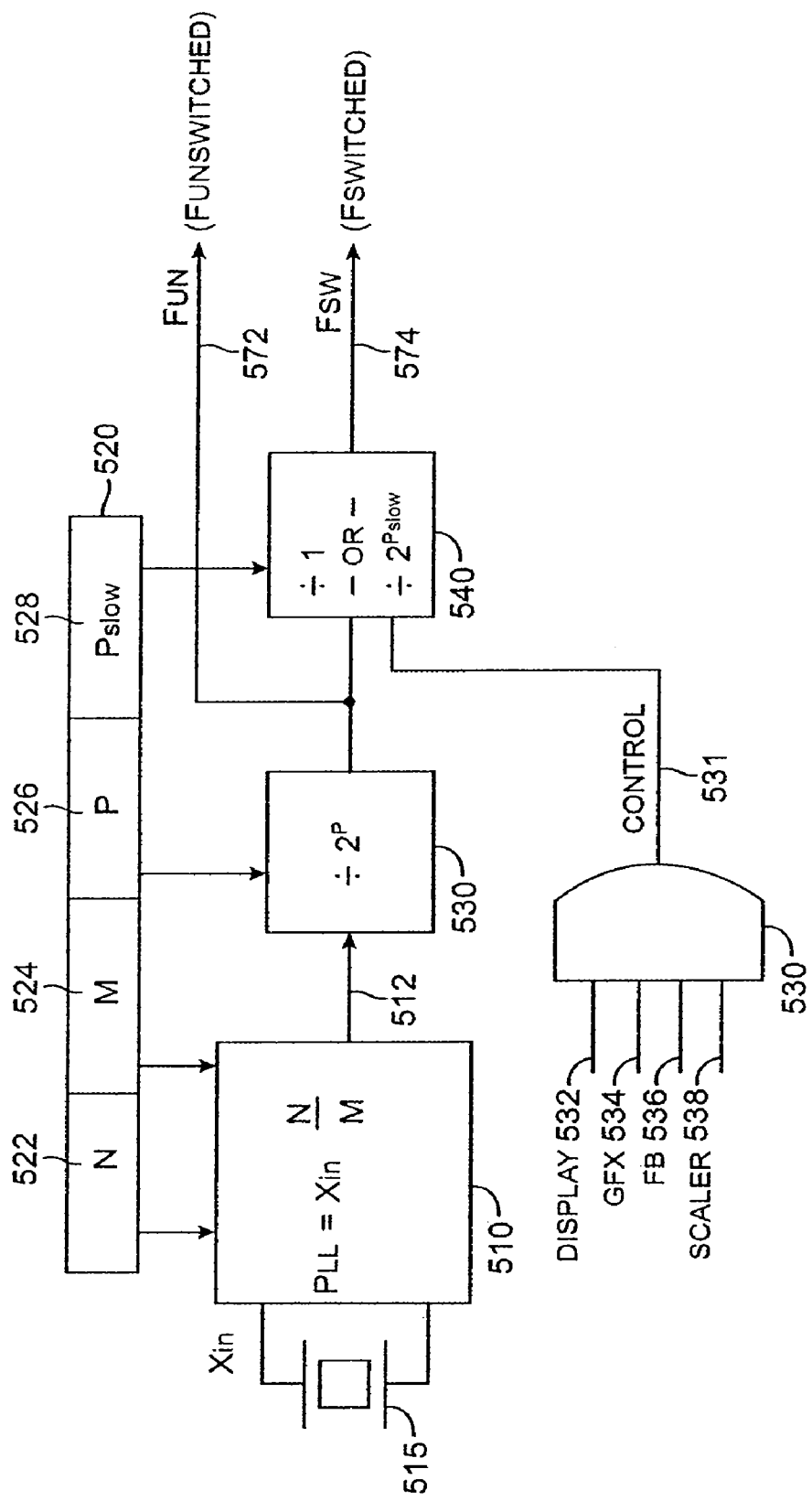
FIG. 5 is a block diagram of an alternative memory clock PLL and associated circuitry that may be used as the memory clock PLL in FIG. 3 or as a memory clock PLL and associated circuitry in other embodiments of the present invention.

FIG. 5 is a block diagram of an alternative memory clock PLL and associated circuitry that may be used as the memory clock PLL MPLL 370 in FIG. 3 or as a memory clock PLL and associated circuitry in other embodiments of the present invention. This alternative memory clock PLL and associated circuitry includes PLL 510, which is driven by crystal 515, frequency dividers 530 and 540, switching logic gate 550, and programmable registers 520.

As before, the PLL 510 receives a signal at frequency Xin from crystal 515. The output of the PLL 510, signal PLL on line 512, is received by the divider 530. Divider 530 provides an unswitched memory clock signal Fun on line 572, which in turn drives divider 540 that provides a switched memory clock signal Fsw on line 574. The switched memory clock signal Fsw on line 574 is switched under control of the switch logic gate 550. As before, if each of the inputs of switch logic gate 510 are active, then the switched memory clock signal Fsw on line 574 may switch to a lower frequency, that is, it may enter the power down or idle mode.

The contents of control register 520 include values for N 522, M 524, P 526, and Pslow 528. The values stored as N 522 and M 524 scale the output frequency of the signal PLL on line 512 to be equal to the frequency Xin times N 522 divided by M 524. The divider 530 divides the frequency of the signal PLL on line 512 by the factor $2^{\wedge\wedge}P$," and provides the unswitched memory clock signal Fun on line 572. The register 520 provides the value Pslow 528 to the divider 540. In the high-speed or fast mode, the frequency of the switched memory clock signal Fsw on line 574 is equal to the frequency of the unswitched memory clock signal Fun on line 572 divided by 1, that is, the frequency is unchanged. In the slow mode, the frequency of the switched memory clock signal Fsw on line 574 is equal to the frequency of the unswitched memory clock signal Fun on line 572 divided by $2^{\wedge\wedge}(Pslow)$.

There are at least two potential problems with the architectures shown in FIGS. 4 and 5 that are accounted for by exemplary embodiments of the present invention. The first of these is when the switched memory clock signal Fsw on line 374 switches back to full speed, it may begin transitioning out of phase with the unswitched memory clock signal Fun on line 372. The second is that there may be jitter or skew in the timing between these two clocks. In order to ease timing between circuits receiving these clocks, the switched memory clock signal Fsw on line 374 and the unswitched memory clock signal Fun on line 372 should remain in phase and aligned while the switched memory clock signal Fsw on line 374 is in the high-speed mode.

FIG. 6A is a timing diagram illustrating how the switched memory clock signal Fsw on line 374 may become out of phase with the unswitched memory clock signal Fun on line 372. This timing diagram includes signals PLL 610, Fun 620, control 630, and Fsw 640. The signal PLL 610 is the signal generated by a PLL, or other appropriate circuitry, and provided to the dividers. Fun 620 is the unswitched memory clock signal, while Fsw 640 is the switched memory clock signal. The control signal 630 is a control signal such as the control signal generated by control logic gates 450 in FIGS. 4 and 550 FIG. 5. For exemplary purposes, P is equal to zero, such that the frequency of the unswitched memory clock signal Fun 620 is the same as the frequency of the PLL signal 610. Before time T1 632, the unswitched memory clock signal Fun 620 and the switched memory clock signal Fsw 640 are in phase with each other.

At time T1 632, the control signal 630 goes high, thus the switched memory clock signal Fsw 640 transitions to a lower frequency of operation. In this particular case, Pslow is equal to one such that the switched memory clock signal Fsw 640 transitions at half its original rates. Specifically, during time T2 642, the switched memory clock signal Fsw 640 switches at twice the frequency as it does during time T3 644. At time T4 634, the control signal 630 returns low, thus the frequency of the switched memory clock signal Fsw 640 once again equals the frequency of the unswitched memory clock signal Fun 620. During time T6 648, the switched memory clock signal Fsw 640 transitions low, since it had been high during time T5 646. Thus, during T6 and for the following pulses, the switched memory clock signal Fsw 640 is out of phase with the unswitched memory clock signal Fun 620.

FIG. 6B is a timing diagram showing the switched clock signal Fsw in phase with the unswitched memory clock signal Fun following a power down mode. This timing diagram includes signals PLL 650, Fun 660, control 670, and Fsw 680. Again, after time T7 672, the frequency of the switched memory clock signal Fsw 680 is reduced by one-half. However, when the control signal 670 goes low at time T9 674, the present state of the unswitched memory clock signal Fun 660 and the switched memory clock signal Fsw 680 are compared. In this case, they do not match, that is, the unswitched memory clock signal Fun 660 is low (about to go high) and the switched memory clock signal Fsw 680 is high. Accordingly, a finite-state machine prevents the switched memory clock signal Fsw 680 from switching until the clock phases match. Thus, at time T8 682, the two clocks, the unswitched memory clock signal Fun 660 and the switched memory clock signal Fsw 680, are in phase. Further logic may be added to prevent them from going out of phase due to power supply noise, signal coupling, or other glitches or disturbances.

By performing a "local test" that compares the state of the switched and unswitched clocks, the first problem of the two mentioned above, that is where the two clocks are out of phase, is taken care of. The second problem mentioned above, that is jitter between switched and unswitched clocks, can be addressed by a synchronizing circuit provided by an embodiment of the present invention.

Figure 7:
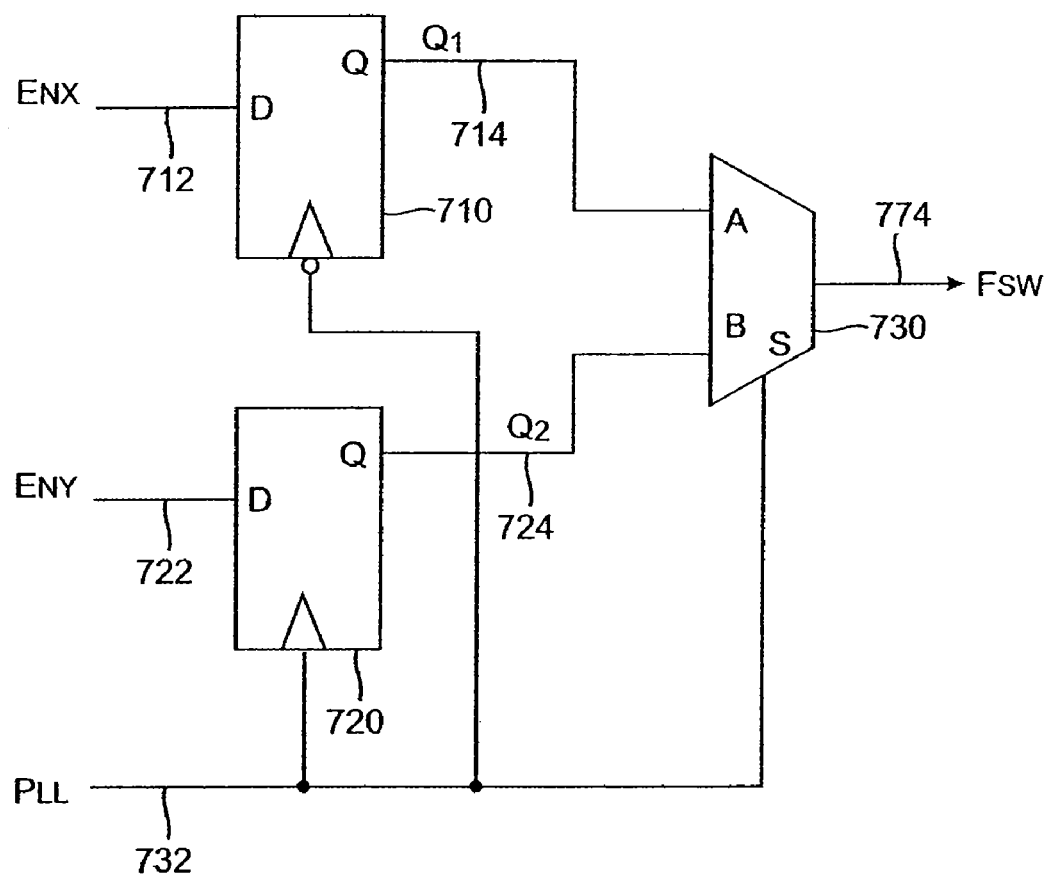
FIG. 7 is a clock synthesizer circuit that may be used to align clock signals in a manner consistent with an embodiment of the present invention.

FIG. 7 is a clock synthesis circuit that may be used to align clock signals in a manner consistent with an embodiment of the present invention. This clock synthesis circuit includes registers or D flip-flops 710 and 720, and multiplexer 730. Flip-flop 710 receives an input signal ENX on line 712 and provides an output Q1 on line 714 to the multiplexer 730. Flip-flop 720 receives an input signal ENY on line 722 and provides an output Q2 on line 724 to the multiplexer 730. The multiplexer 730 selects between the signals Q1 on line 714 and Q2 on line 724 under control of a clock signal, in this case PLL on line 732. In this example, when the clock signal PLL on line 732 is high, the A input, Q1 on line 714 is selected and coupled to the output Fsw on line 774. When the clock signal PLL on line 732 is low, the B input, Q2 on line 724 is selected and coupled to the output Fsw on line 774. PLL also clocks flip-flop 710, while the complement of PLL clocks flip-flop 720.

This circuit retimes the input signals ENX on line 712 and ENY on line 722 to the PLL signal on line 732. Thus, skew or jitter in the input signals ENX on line 712 and ENY on line 722 is removed by the multiplexer 730, and the switched clock output signal Fsw on line 774 is retimed. The same or similar circuit may be used to provide the unswitched memory clock signal Fun (not shown) in order to align both the switched and the unswitched memory clock signals to the PLL signal on line 732 (or to another synchronizing signal), and thus to each other.

Figure 8:
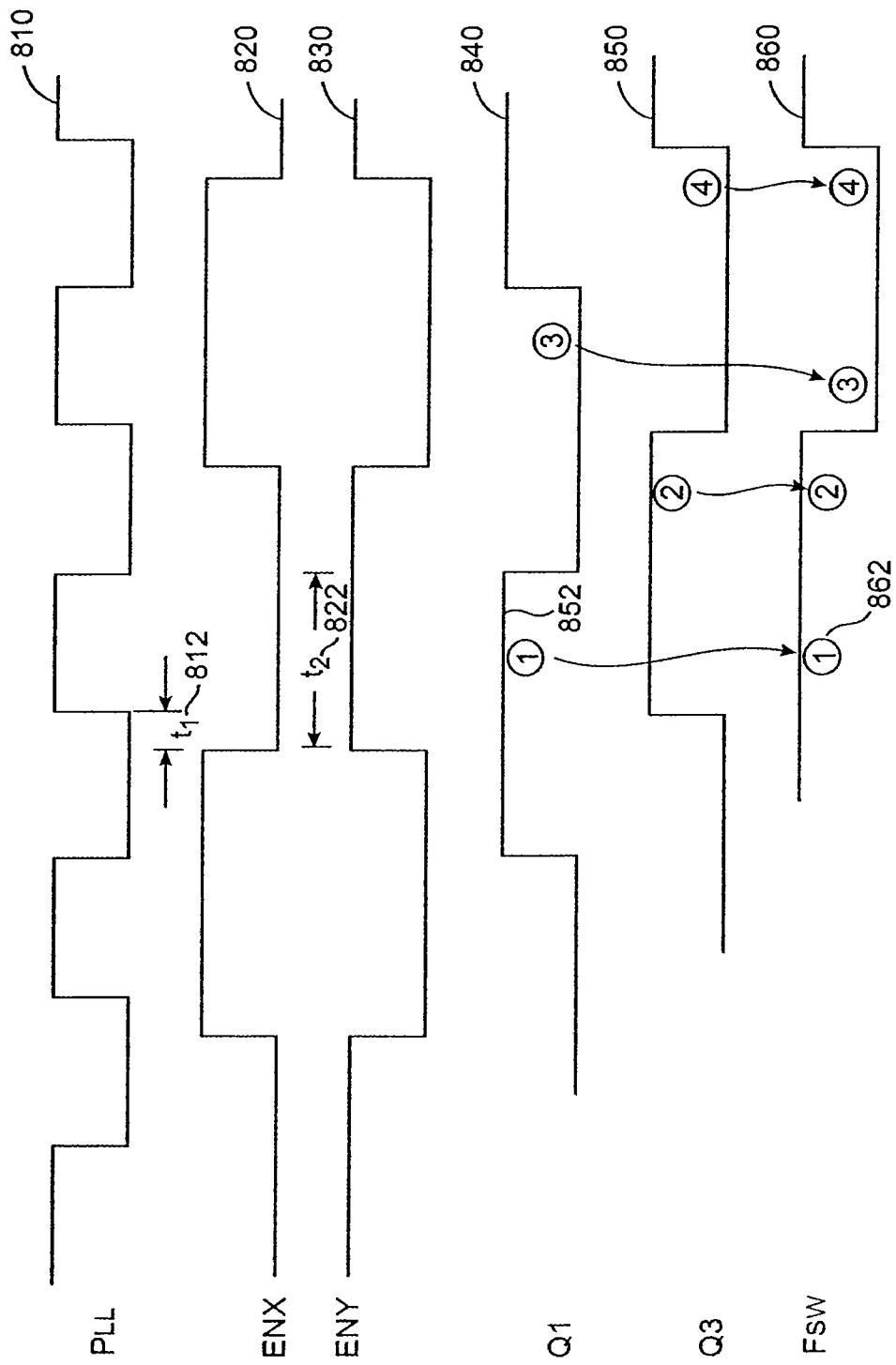
FIG. 8 is a timing diagram of a of method of aligning clock signals that is consistent with an embodiment of the present invention.

FIG. 8 is a timing diagram of a method of aligning clock signals that is consistent with an embodiment of the present invention. This timing diagram may be generated by the circuit shown in FIG. 7 or by another synchronizing circuit consistent with an embodiment of the present invention.

This timing diagram includes a first reference signal, in this case PLL 810, which is generated by a phase-locked loop such as the PLL 410 in FIG. 4 or PLL 510 in FIG. 5, input signal ENX 820 and its complement ENY 830, which may be provided by a finite-state machine as described below, retimed or flip-flop outputs Q1 840 and Q2 850, and multiplexer output Fsw 860.

The inputs ENX 820 and ENY 830 arrived at their respective flip-flops time T1 812 and T2 822 before their respective clock edges. Both of the signals are synchronized, ENX 820 is synchronized as Q1 840 to the falling edges of PLL 810, while ENY 830 is synchronized as Q2 850 to the rising edges of PLL 810. A multiplexer or other selection circuit multiplexes levels 1 852 and 3 854 from Q2 850 and levels 2 842 and 4 844 from Q1 840 to generate the output signal Fsw 860. In this way, the input signal ENX 820 and its complement ENY 830 are synchronized to the PLL signal 810 and provided as output signal Fsw 860.

Figure 9:
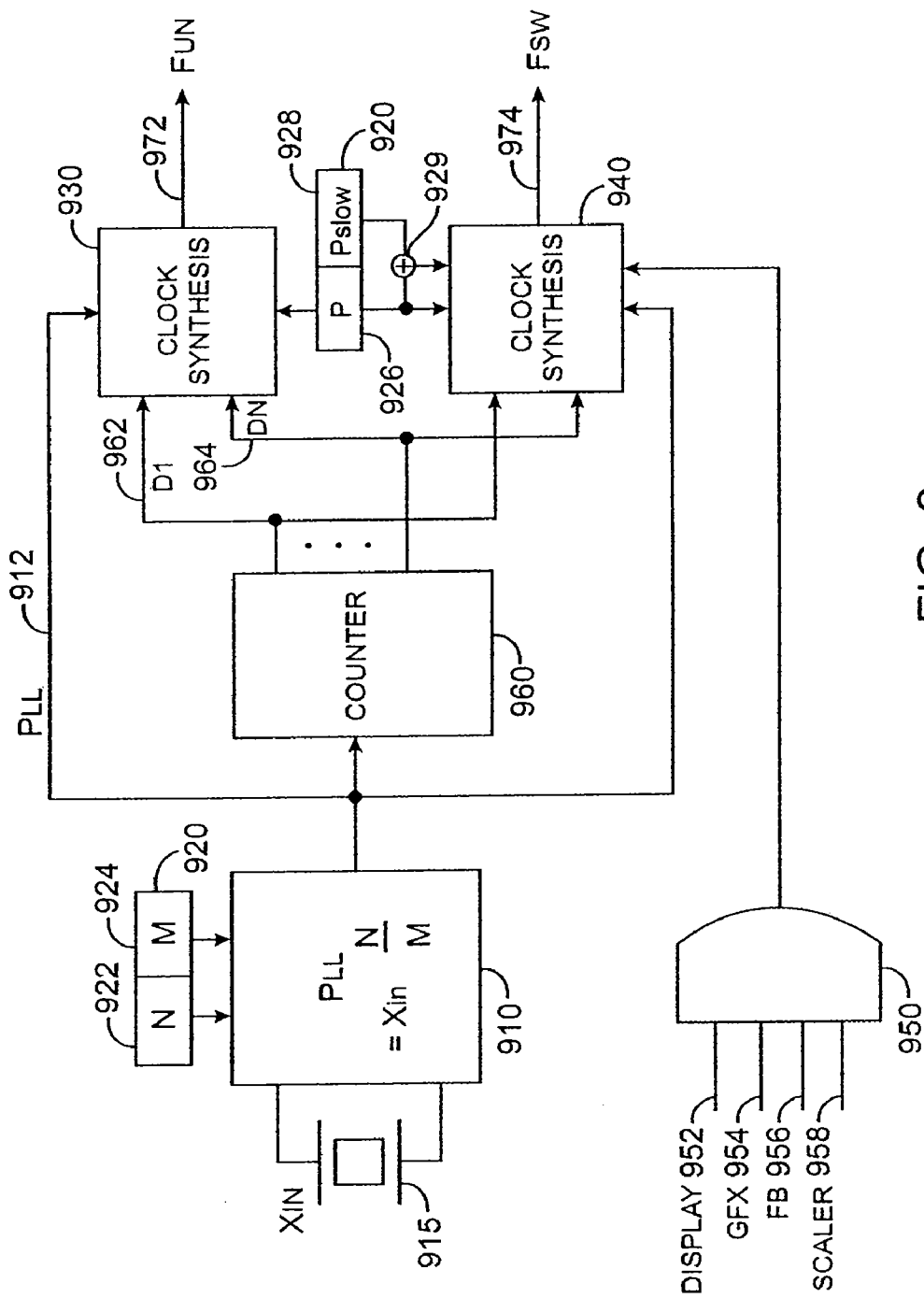
FIG. 9 is a block diagram of a memory PLL and associated circuitry that may utilize a clock synthesizer circuit that is consistent with an embodiment of the present invention.

FIG. 9 is a block diagram of a memory PLL and associated circuitry that may utilize a clock synthesizer circuit that is consistent with an embodiment of the present invention. This memory clock PLL and associated circuitry includes PLL 910, which is driven by crystal 915, counter 960, clock synthesizers 930 and 940, switching logic gate 950, and programmable registers 920.

As before, the PLL 910 receives a signal at frequency Xin from crystal 915 or other stable clock source. The output of the PLL 910, signal PLL on line 912, is received by the counter 960 and clock synthesizers 930 and 940. Clock synthesizer 930 provides an unswitched memory clock signal Fun on line 972, while clock synthesizer 940 provides a switched memory clock signal Fsw on line 974. The switched clock signal Fsw on line 974 is switched under control of the switch logic gate 950. When each of the inputs of switched logic gate 950 are active, the switched clock signal Fsw on line 974 may switch to a lower frequency, that is, it may enter the power down or idle mode.

The contents of control register 920 include values for N 922, M 924, P 926, and Pslow 928. The values stored as N 922 and M 924 scale the output frequency of the signal PLL on line 912. Specifically, the frequency of the signal PLL on line 912 is equal to the frequency Xin times N 922 divided by M 924. The counter 960 counts pulses of the PLL signal on line 912. The counter 960 may be formed by a chain of flip-flops, the first having a clock input driven by the PLL signal on line 912, with the subsequent flip-flop clock inputs driven by the Q output of the previous flip-flop, where the complement of the Q output is connected to the D input for each flip-flop. This circuit generates divided versions of the PLL signal on line 912. For example, it may provide signals having one-half, one-fourth, and one-eighth the frequency of the PLL signal on line 912. Further divide ratios may be similarly provided. These signals are provided to the clock synthesizers as signals D1 on line 962 through DN on line 964.

The synthesizers 940 and 940 receive the signals D1 on line 962 through DN on line 964, and select one based on the values of P 926 and Pslow 928 in registers 920. Specifically, the clock synthesizer 930 selects the signal having the frequency of the signal PLL on line 912 divided by the factor $2^{\wedge\wedge}P$, again where "$^{\wedge\wedge}$" is a symbol meaning "to the power of." The adder 929 adds the contents of P 926 and Pslow 928 and provides it along with the value of P 926 to synthesizer 940. In the high-speed or fast mode, the signal selected by the clock synthesizer 940 has a frequency that is equal to the frequency of the signal PLL on line 912 divided by $2^{\wedge\wedge}P$. In the slow mode, the signal selected by the clock synthesizer 940 has a frequency that is equal to the frequency of the signal PLL divided by $2^{\wedge\wedge}(P+Pslow)$.

In this architecture, in the fast mode, the clock synthesizers 930 and 940 may select the same signal in the signals D1 on line 962 through DN on line 964. Thus, when transitioning out of the idle or low-power state, the unswitched memory clock signal Fun on line 972 is in phase with the switched memory clock signal Fsw on line 974.

Figure 10:
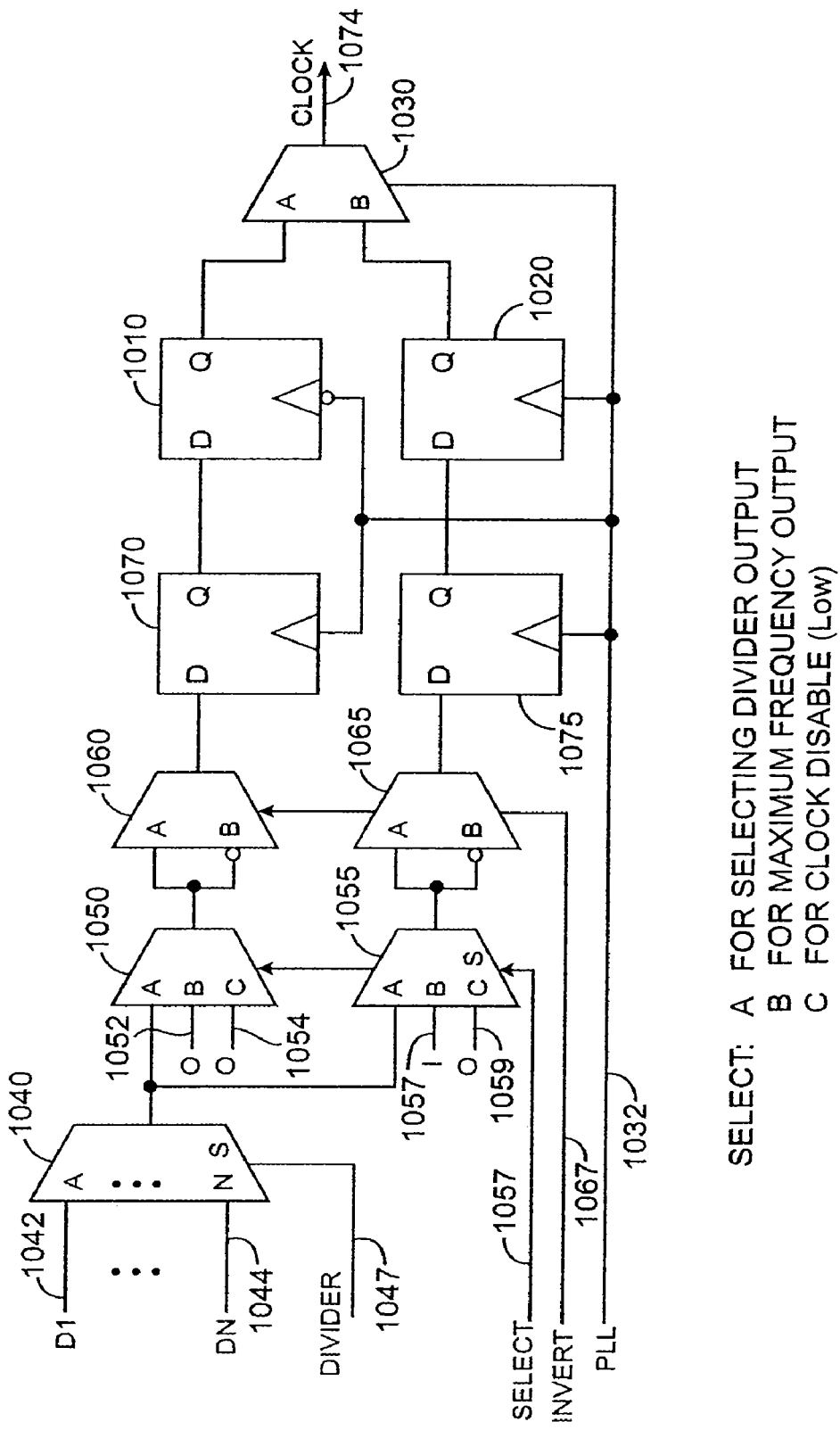
FIG. 10 is a more complete block diagram of a clock synthesizer circuit that is consistent with an embodiment of the present invention.

FIG. 10 is a more complete block diagram of a clock synthesizer circuit that is consistent with an embodiment of the present invention. This clock synthesizer circuit may be used as the clock synthesizer circuits 930 and 940 in FIG. 9, or as clock synthesizer circuits in other embodiments of the present invention. This clock synthesizer circuit includes the circuit structure from FIG. 7, specifically flip-flops 110 and 1020, and multiplexer 1030, as well as divider multiplexer 1040, and flip-flops 1070 and 1075.

The divide multiplexer 1040 receives one or more signals on lines 1047 that select one of the inputs D1 1042 through DN 1044. The divider multiplexer 1040 provides an output to the select multiplexers 1050 and 1055. The select multiplexers 1050 and 1055 receive one or more select signals on lines 1057. These select multiplexers 1050 and 1055 may be configured to place in this synthesizer circuit in different modes.

In this specific example, when the input A is selected, the divide signal selected by the divider multiplexer 1040 is retimed and passed as the clock signal on line 1072. Specifically, the output of the divider multiplexer 1040 is passed by the select multiplexers 1050 and 1055, through the inverter multiplexers 1060 and 1065, where it is retimed by the flip-flops 1070, 1075, 1010, and 1020.

In this way, the clock signal on line 1072 is only delayed by one gate relative to the signal PLL on line 1032, specifically the select-to-output delay of the multiplexer 1030. This reduces the jitter associated with the clock signal on line 1072, since each gate adds uncertainty, or jitter, to the signal. This reduction in the number of gate delays is particularly important in high-speed circuits, or circuits that are jitter sensitive. Accordingly, when both memory clocks, the unswitched memory clock signal on line 372 and the switched memory clock signal on line 374, pass through one of these synthesis circuits, the skew between them is reduced or at least limited.

When the B inputs are selected on select multiplexers 1050 and 1055, the select multiplexer 1050 receives a low or zero input on line 1052, while select multiplexer 1055 receives a high or one on line 1057. In this way, the output multiplexer 1030 provides an alternating pattern of zeros and ones at the frequency of the signal PLL on line 1032. This mode provides a divider bypass and retiming function for the signal PLL on line 1032

When the C inputs are selected on select multiplexers 1050 and 1055, the select multiplexer 1050 receives a low or zero input on line 1054, and select multiplexer 1055 receives a low or zero on line 1057. In this mode, the clock output on line 1072 remains low.

The inverter multiplexers 1060 and 1065 receive the outputs of the select multiplexers 1050 and 1055, as well as their complements. In this way, the clock signal on line 1032 may be inverted. It will be appreciated by one skilled in the art that other selections may be made, and that these and other multiplexers and select circuits may be added and changed consistent with the present invention.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of reducing power dissipation in a graphics processor, the method comprising:
   providing a first memory clock and a second memory clock;
   placing a portion of the graphics processor in a reduced power state by reducing the second memory clock's frequency;
   checking a state of the first memory clock and a state of the second memory clock;
   removing the portion of the graphics processor from the reduced power state by increasing the second memory clock's frequency when the state of the first memory clock matches the state of the second memory clock; and
   providing the first memory clock to a memory, the memory not in the graphics processor, wherein the first memory clock's frequency does not change when the portion of the graphics processor is placed in and removed from the reduced power state.

2. The method of claim 1 further comprising aligning the second memory clock to the first memory clock.

3. The method of claim 1 further comprising:
   aligning the first memory clock signal to a first reference signal; and
   aligning the second memory clock signal to the first reference signal.

4. The method of claim 3 wherein the first reference signal is provided by a phase-locked loop.

5. The method of claim 1 wherein removing the portion of the graphics processor from the reduced power state by increasing the second memory clock's frequency when the state of the first memory clock matches the state of the second memory clock comprises increasing the second memory clock's frequency when the first memory clock and the second memory clock are approximately aligned.

6. A method of reducing power dissipation in a graphics processor, the method comprising:
   providing a first clock and a second clock;
   providing the first clock to an external memory;
   providing the second clock to a plurality of circuits in the graphics processor;
   determining that each of the plurality of circuits in the graphics processor are inactive;
   reducing a frequency of the second clock;
   determining that at least one of the plurality of circuits in the graphics processor is active;
   determining that the first clock and the second clock are in a same state; and
   increasing the frequency of the second clock.

7. The method of claim 6 wherein determining that the first clock and the second clock are in a same state comprises determining that first clock and the second clock are approximately aligned.

8. The method of claim 6 wherein the first clock and the second clock are generated using a reference clock.

9. The method of claim 8 wherein the reference clock is generated using a crystal and a phase-locked loop.

10. The method of claim 6 wherein providing the second clock to a plurality of circuits in the graphics processor comprises providing the second clock to a frame buffer interface.

11. The method of claim 6 wherein providing the second clock to a plurality of circuits in the graphics processor comprises providing the second clock to a graphics circuit.

12. The method of claim 6 wherein the second clock is generated using the first clock.

13. A method of reducing power dissipation in a graphics processor, the method comprising:
   providing a first clock and a second clock;
   providing the first clock to an external memory;
   providing the second clock to a plurality of circuits in the graphics processor;
   entering a lower-power state by reducing a frequency of the second clock; and
   leaving the lower-power state by determining that the first clock and the second clock are in a same state and then increasing the frequency of the second clock.

14. The method of claim 13 wherein determining that the first clock and the second clock are in a same state comprises determining that first clock and the second clock are approximately aligned.

15. The method of claim 13 wherein the first clock and the second clock are generated using a reference clock.

16. The method of claim 15 wherein the reference clock is generated using a crystal and a phase-locked loop.

17. The method of claim 15 wherein the first clock is generated using a first phase-locked loop and the second clock is generated using a second phase-locked loop, where the first phase-locked loop and the second phase-locked loop receive the reference clock.

18. The method of claim 13 wherein providing the second clock to a plurality of circuits in the graphics processor comprises providing the second clock to a frame buffer interface.

19. The method of claim 13 wherein providing the second clock to a plurality of circuits in the graphics processor comprises providing the second clock to a graphics circuit.

20. The method of claim 13 wherein the second clock is generated using the first clock.

* * * * *